(12) United States Patent
Iida et al.

(10) Patent No.: US 6,215,139 B1
(45) Date of Patent: Apr. 10, 2001

(54) SOLID-STATE IMAGE SENSOR AND MANUFACTURING METHOD THEREOF

(75) Inventors: Yoshinori Iida, Tokyo; Hidetoshi Nozaki, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/129,697

(22) Filed: Aug. 5, 1998

(30) Foreign Application Priority Data

Aug. 6, 1997 (JP) .................................................. 9-212029

(51) Int. Cl.[7] ...................... H01L 31/062; H01L 31/113; H01L 27/148; H01L 31/06
(52) U.S. Cl. ........................ 257/291; 257/290; 257/293; 257/233; 257/461
(58) Field of Search ................................ 257/292, 243, 257/461, 290, 291, 293, 297, 231, 233

(56) References Cited

U.S. PATENT DOCUMENTS

| | | | |
|---|---|---|---|
| 5,101,253 | * 3/1992 | Mizutani et al. | 257/292 |
| 5,111,263 | * 5/1992 | Stevens | 257/243 |
| 5,343,061 | * 8/1994 | Yamashita et al. | 257/229 |
| 5,625,210 | * 4/1997 | Lee et al. | 257/292 |
| 5,726,475 | * 3/1998 | Sawada et al. | 257/369 |

* cited by examiner

*Primary Examiner*—Matthew Smith
*Assistant Examiner*—Lex H. Malsawma
(74) *Attorney, Agent, or Firm*—Oblon, Spivak, McClelland, Maier & Neustadt, P.C.

(57) ABSTRACT

An amplifying solid-state image sensor includes a semiconductor substrate, and a plurality of unit pixels arranged on the semiconductor substrate in a two-dimensional manner, in which each of the plurality of unit pixels includes a photodiode for performing the photoelectric conversion, a storage diode for storing electric signal charge obtained by the photodiode, an amplifying transistor for amplifying the electric signal charge stored in the storage diode, and a signal reading section for reading a signal voltage from the amplifying transistor, and in which each of the plurality of unit pixels has a first active region and a second active region in which the second active region has the same conductivity type as that of the semiconductor substrate and an impurity concentration higher than that of the semiconductor substrate, the photodiode in each of the unit pixels is formed in the first active region, and the amplifying transistor is formed in the second region. With this configuration, it is preferable the photodiode has near a surface thereof a pinned photodiode structure in which a photodiode surface high-concentrated impurity region is formed.

7 Claims, 4 Drawing Sheets

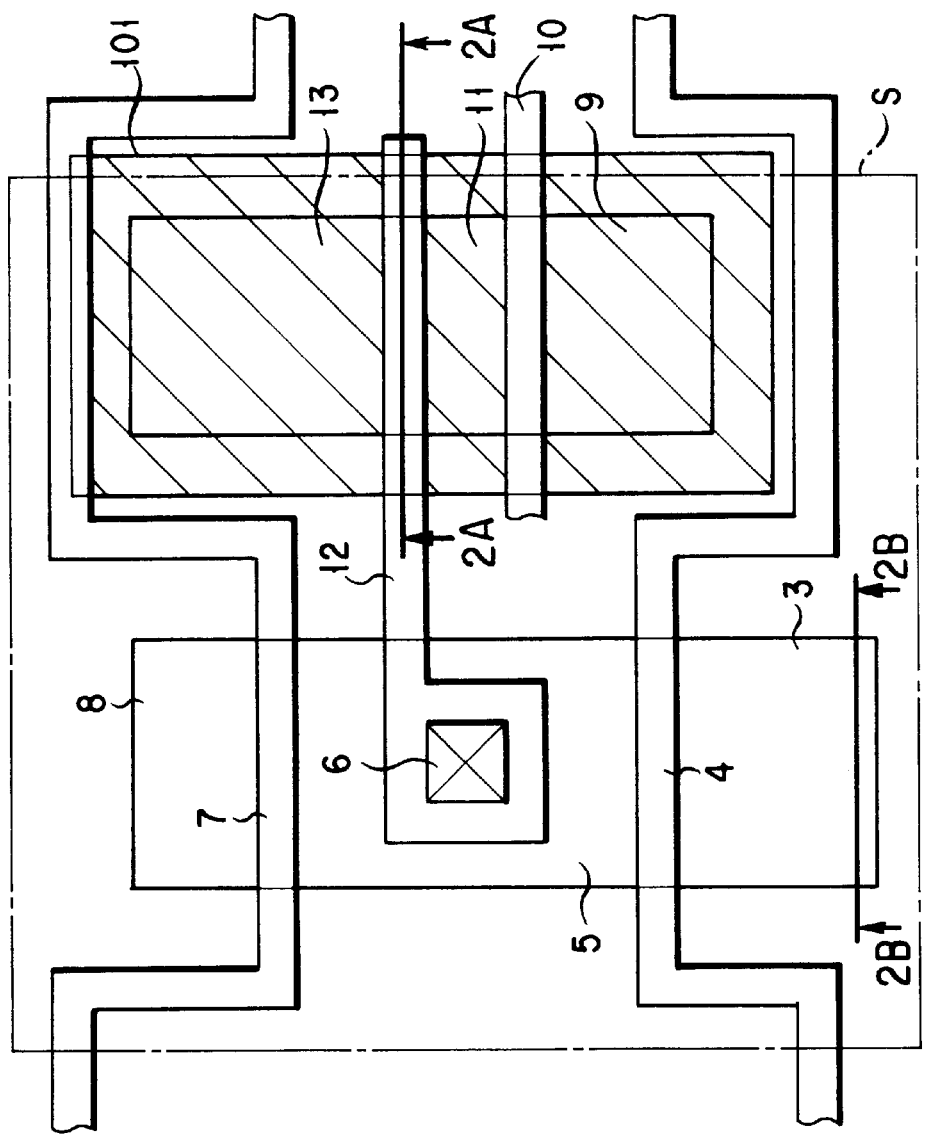
F I G. 1

SOLID-STATE IMAGE SENSOR AND MANUFACTURING METHOD THEREOF

BACKGROUND OF THE INVENTION

This invention relates to an amplifying solid-state image sensor for amplifying an electric signal charge obtained by a photodiode in units of a pixel to obtain an electric signal, in particular, an amplifying solid-state image sensor intended to improve the structure of pixels, and a manufacturing method thereof.

In recent years, an amplifying solid-state image sensor having high sensitivity derived from an amplifying function provided to each pixel has attracted attention. Such an amplifying solid-state image sensor changes a potential at an electric signal charge accumulation section by using electric signal charges obtained by photoelectric conversion. The change of the potential at the electric signal charge accumulation section modulates an amplifying transistor in each pixel, which amplifies the electric signal charge. This amplifying function allows the amplifying solid-state image sensor to have high sensitivity, and an operation such as increasing the number of the pixels or reducing the pixels in size due to the reduction of the image size can be suitably performed in such a device.

Each pixel in the amplifying solid-state image sensor as described above generally comprises such components as a photodiode for performing the photoelectric conversion; a reset transistor for resetting the potential of the photodiode; an amplifying transistor for amplifying an electric signal charge; and a wiring connecting a selection transistor for selecting a desired line or a charge coupled photodiode, with a gate of the amplifying transistor. When the photoelectrically converted electric signal charge needs to be temporarily stored, the image sensor is provided with a storage diode in a region different from that of the photodiode, and with a transfer transistor arranged between the photodiode and the storage diode.

The above-mentioned pixel structure of the amplifying solid-state image sensor has two active regions on a semiconductor substrate which have the same impurity concentration as that of the semiconductor substrate: an active region relating to the photoelectric conversion, i.e., an active region in which the photodiode, the transfer transistor, the storage diode, and the reset transistor are formed; and an active region in which an amplifying transistor is formed. Due to this structure, however, the following problems occur:

In order to decrease noise (a dark current) generated in the photodiode during the photoelectric conversion, it is remarkably effective to suppress the influence of an electric current generated in the Si—SiO$_2$ interface on the surface of the semiconductor substrate. To suppress the influence of the electric current, a so-called pinned photodiode structure is generally used: the pinned photodiode structure is obtained by doping a p-type impurity having a high concentration into the region near the Si—SiO$_2$ interface in the photodiode section.

In the meantime, in order to decrease the amplifying transistor in size to satisfy the request for reduction of a pixel size, the impurity concentration of the semiconductor substrate at a region where the amplifying transistor is formed needs to be increased in accordance with the general scaling rule. The amplifying transistor and the photodiode are, however, both formed on the semiconductor substrate so as to have the same impurity concentration as that of the semiconductor substrate, as described before. If the impurity concentration of the substrate is increased to decrease the amplifying transistor in size, the impurity concentration of a region of the substrate, on which the photodiode is formed, is also naturally increased. On a substrate with such a high impurity concentration, the pinned photodiode cannot be easily formed for the reason suggested below.

The semiconductor substrate and the photodiode have conductivity types opposite to each other, and thus the impurity concentrations of the substrate and the photodiode region offset each other, with the result that the photodiode impurity region will be reduced in impurity concentration and area. With such a structure, a sufficient capacity for storing the electric charge cannot be attained securely. When the photodiode impurity region is formed in the semiconductor substrate having a low impurity concentration, no problems will occur. In a device having a substrate with a high impurity concentration, however, a considerably big problem may occur.

As described above, it is necessary to increase the impurity concentration in the substrate in order to reduce the size of the amplifying transistor in the conventional amplifying solid-state image sensor in accordance with the general scaling rule. If the impurity concentration in the substrate is increased, however, the low dark-current characteristics of the photodiode may be deteriorated.

BRIEF SUMMARY OF THE INVENTION

The object of the present invention is to provide an amplifying solid-state image sensor capable of reducing pixels in size without deteriorating the low dark-current characteristics of a photodiode.

To achieve the above subject matter, the present invention uses the following structures.

An amplifying solid-state image sensor according to the present invention comprises: a semiconductor substrate; and a plurality of unit pixels arranged on the semiconductor substrate in a two-dimensional manner, in which each of the plurality of unit pixels includes a photodiode for performing the photoelectric conversion, a storage diode for storing electric signal charge obtained by the photodiode, an amplifying transistor for amplifying the electric signal charge stored in the storage diode, and a signal reading section for reading a signal voltage from the amplifying transistor, and in which each of the plurality of unit pixels has a first active region and a second active region in which the second active region has the same conductivity type as that of the semiconductor substrate and an impurity concentration higher than that of the semiconductor substrate, the photodiode in each of the unit pixels is formed in the first active region, and the amplifying transistor is formed in the second region. With this configuration, it is preferable the photodiode has near a surface thereof a pinned photodiode structure in which a photodiode surface high-concentrated impurity region is formed.

A manufacturing method of an amplifying solid-state image sensor according to the present invention, which has a plurality of unit pixels arranged on a semiconductor substrate in a two-dimensional manner, the plurality of unit pixels each being provided with a photodiode for performing the photoelectric conversion; a storage diode for storing electric signal charge obtained by the photodiode; an amplifying transistor for amplifying the electric signal charge stored in the storage diode; and a signal reading section for reading a signal voltage from the amplifying transistor, comprises the steps of forming a field insulation film for isolating elements on the semiconductor substrate, forming an impurity region having the same conductivity type as that of the semiconductor substrate and having an impurity concentration higher than that of the semiconductor substrate by performing ion implantation in an active region in each of the unit pixels, the active region being at least other than a region in which the photodiode is to be formed, and forming the photodiode, the storage diode, the reset transistor, the amplifying transistor, and the signal reading section. With this structure, it is preferable the photodiode has near a surface thereof a pinned photodiode structure in which a photodiode surface high-concentrated impurity region is formed and/or the step of forming the active region includes a step of forming a high-concentrated impurity region in a self-alignment manner.

The preferred manners are as follows.

(1) A high-concentrated impurity region, which has the same conductivity type as that of the substrate and an impurity concentration higher than that of the substrate, is formed only in an active region in which the amplifying transistor is to be formed.

(2) A high-concentrated impurity region having the same conductivity type as that of the substrate, in which an impurity concentration is higher than that of the substrate, is formed in a part of an active region, which contains a photodiode, a storage diode, a reset transistor and the like, and is other than a region in which the photodiode is to be formed, and in an active region in which an amplifying transistor is to be formed.

According to the above-mentioned constitutions of each unit pixel of the present invention, a high-concentrated impurity region having the same conductivity type as that of the substrate and an impurity concentration higher than that of the substrate is formed in the region other than that having the photodiode section. With such a structure, the amplifying transistor can be formed fine in accordance with the general scaling rule, and the low dark-current characteristics of the photodiode can be maintained. Therefore, the present invention can realize an amplifying solid-state image sensor having both a fine amplifying transistor and a pinned photodiode structure capable of suppressing a dark current, which cannot be easily attained by the conventional technique. Such an amplifying solid-state image sensor of the present invention can reduce each pixel in size while the low dark-current characteristics of the photodiode are maintained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view of an amplifying solid-state image sensor according to the first embodiment, for showing a layout of a unit pixel;

DETAILED DESCRIPTION OF THE INVENTION

Figure 2A:
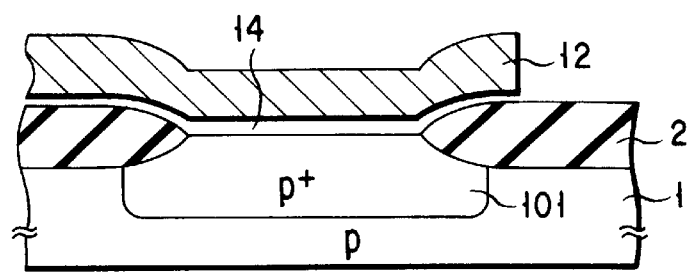
FIGS. 2A and 2B are sectional views of the amplifying solid-state image sensor shown in FIG. 1 taken along lines 2A—2A and 2B—2B.

The embodiments of the present invention will be described below with reference to the drawings.

[First Embodiment]

FIG. 1 shows an amplifying solid-state image sensor according to the first embodiment, for showing a layout of a unit pixel.

In the drawing, a region enclosed by a one-dot line is denoted as a pixel region S. FIG. 1 shows a photodiode 3, a gate 4 of a transfer transistor, a storage diode 5, a gate contact 6 of an amplifying transistor, a gate 7 of a reset transistor, a drain 8 of the reset transistor, a source (signal output section) 9 of an amplifying transistor, a gate 10 of an address transistor, a floating diffusion layer 11, a gate 12 of the amplifying transistor, a drain 13 of the amplifying transistor, and a high-concentrated impurity region 101, in addition to the pixel region.

The pixel region S (a unit pixel) has two active regions: a first active region contributing to the photoelectric conversion; and a second active region contributing to the signal amplification.

For simplification of the drawing, some of the elements constituting the device are omitted from FIG. 1. For example, the address gate 10 for selecting a desired pixel is formed to connect neighboring pixels in the horizontal direction in order to select a desired pixel on the same line by receiving one address pulse signal. The gate 10 thus extends like a belt. FIG. 1, however, does not show the extending portion of the address gate 10 connecting to the neighboring pixels.

Similarly, the drain 8 of the reset transistor for resetting the potentials of the photodiode 3 and the storage diode 5 (which will be described later) is connected to drain wiring (not shown) made of aluminum via a contact hole (not shown). But the drain wiring is omitted from FIG. 1.

In the same way, the source 9 and the drain 13 of the amplifying transistor are also connected to drain wiring (not shown) and a signal line (not shown), which are made of aluminum, via contact holes (not shown). But the connection wirings are omitted from FIG. 1. The source 9 is connected to the load transistor allocated at external of image region to constitute a source follower circuit.

Figure 2B:
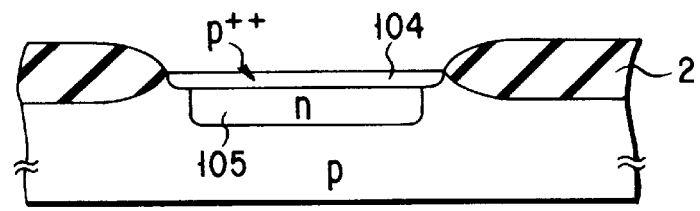

FIG. 2A shows a sectional view of the amplifying transistor section taken along a line 2A—2A, and FIG. 2B shows a sectional view of the photodiode taken along a line 2B—2B. In the amplifying transistor section (the second active region), the high-concentrated impurity region (p$^+$ layer) 101 is formed to have a depth of 200–300 nm. Above the high-concentrated impurity region 101, a gate electrode 12 is formed via a gate oxide film 14. The impurity concentration in the high-concentrated impurity region 101 is around $1 \times 10^{17}$ cm$^3$ in a 0.6 μm MOS transistor, for example, which may vary in accordance with the type of the transistor. The high-concentrated impurity region 101 is further provided with a source/drain region (not shown) to arrange the gate electrode 12 in the midst of the source/drain region to form a MOS transistor. On the other hand, in the photodiode section, a photodiode is constituted by a surface high-concentrated impurity layer (p$^{++}$ layer) 104, p-type semiconductor substrate 1 and an impurity layer (n layer) 105.

Figure 3:
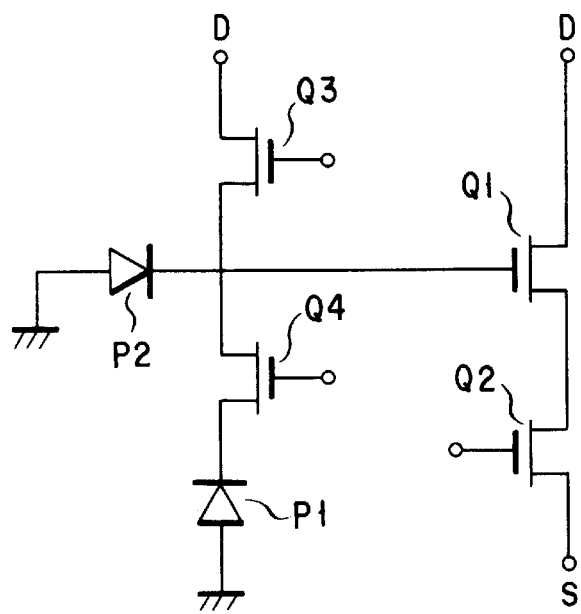
FIG. 3 is an equivalent circuit diagram of the amplifying solid-state image sensor shown in FIG. 1.

FIG. 3 is an equivalent circuit diagram of one unit pixel. Q1 denotes the amplifying transistor, Q2 denotes the address transistor, Q3 denotes the reset transistor, Q4 denotes the transfer transistor, P1 denotes the photodiode, and P2 denotes the storage diode.

Next, the operation of the solid-state image sensor of the embodiment will be described below with reference to a pixel region (the first active region) shown in FIG. 1.

Prior to the photoelectric conversion, the potential of the photodiode 3 which serves as the photoelectric conversion section and the potential of the storage diode 5 for storing the electric signal charge generated by the photoelectric conversion are reset at the level of the potential of the reset drain 8 through the transfer gate 4 and the reset gate 7.

Subsequently, the reset gate 7 and the transfer gate 4 are closed to store the electric signal charge generated by the photodiode 3 for a predetermined charge storage period of time, and then transfer the electric signal charge to the storage diode 5 through the transfer gate 4 in order to store the electric signal charge therein.

The electric signal charge stored in the storage diode 5 modulates the potential of the amplifying gate 12 of the amplifying transistor connected to the storage diode 5 through the contact hole 6. The potential of the amplifying gate 12 of the amplifying transistor can be externally read through a signal line (not shown) in a form of a source voltage of the source 9 of the amplifying transistor, which will be generated by applying a drain voltage to the drain 13 of the amplifying transistor in a condition where the address gate 10 of the address transistor is opened.

The photodiode 3 has a so-called pinned photodiode structure wherein a photodiode surface high-concentrated impurity region 104 is formed near the surface of the photodiode, as shown in the sectional view of the photodiode 3 (FIG. 2B). The pinned photodiode structure prevents the charge generated near the surface of the photodiode from being stored in the photodiode impurity region 105, and thereby allows the photodiode to have the low dark-current characteristics.

In the present embodiment, a unit pixel has two regions having different levels of the surface impurity concentrations. One of the regions is formed near the active region containing the photodiode and contributes to the photoelectric conversion (see FIG. 2B). This region has a surface impurity concentration equal to that of the p-type semiconductor substrate 1 formed from Si or the like. Another one of the two regions is formed in a region near the amplifying transistor region (see FIG. 2A) by doping a high concentration of an impurity having the same conductivity type as that of the semiconductor substrate into a region near the surface of the semiconductor substrate 1.

With such a structure, the amplifying transistor can be reduced in size in accordance with the general scaling rule. At this time, the impurity concentration of the surface high-concentrated impurity layer 101 can be determined independently from the impurity concentration of the photodiode impurity layer 105. The image sensor of the present embodiment thus has both the fine amplifying transistor and the pinned photodiode structure capable of suppressing a dark current. In other words, the pixels can be reduced in size while maintaining the low dark-current characteristics of the photodiode.

In the embodiment shown in FIG. 1, the surface high-concentrated impurity layer 101 is formed slightly larger than the amplifying transistor active region in order to clearly show the relationship between the layer 101 and the amplifying transistor. The region of the surface high-concentrated impurity layer 101 may be arbitrarily arranged if the region 101 is formed to meet the object of the present invention, that is, if the region 101 contains the amplifying transistor active region and does not affect the impurity concentration of the active region of the photodiode.

It also goes without saying that a high-concentrated field impurity concentration region which is provided immediately under the field oxide film 2 in the normal element isolation process may be formed in necessity, though FIG. 1 does not show such a region. Further, the field oxide film 2 may be formed not only by the selective oxidation process such as a LOCOS, but also by burying an oxide film in a groove formed in a substrate, or by growing an oxide film on the substrate by the CVD method.

[Second Embodiment]

Figure 4:
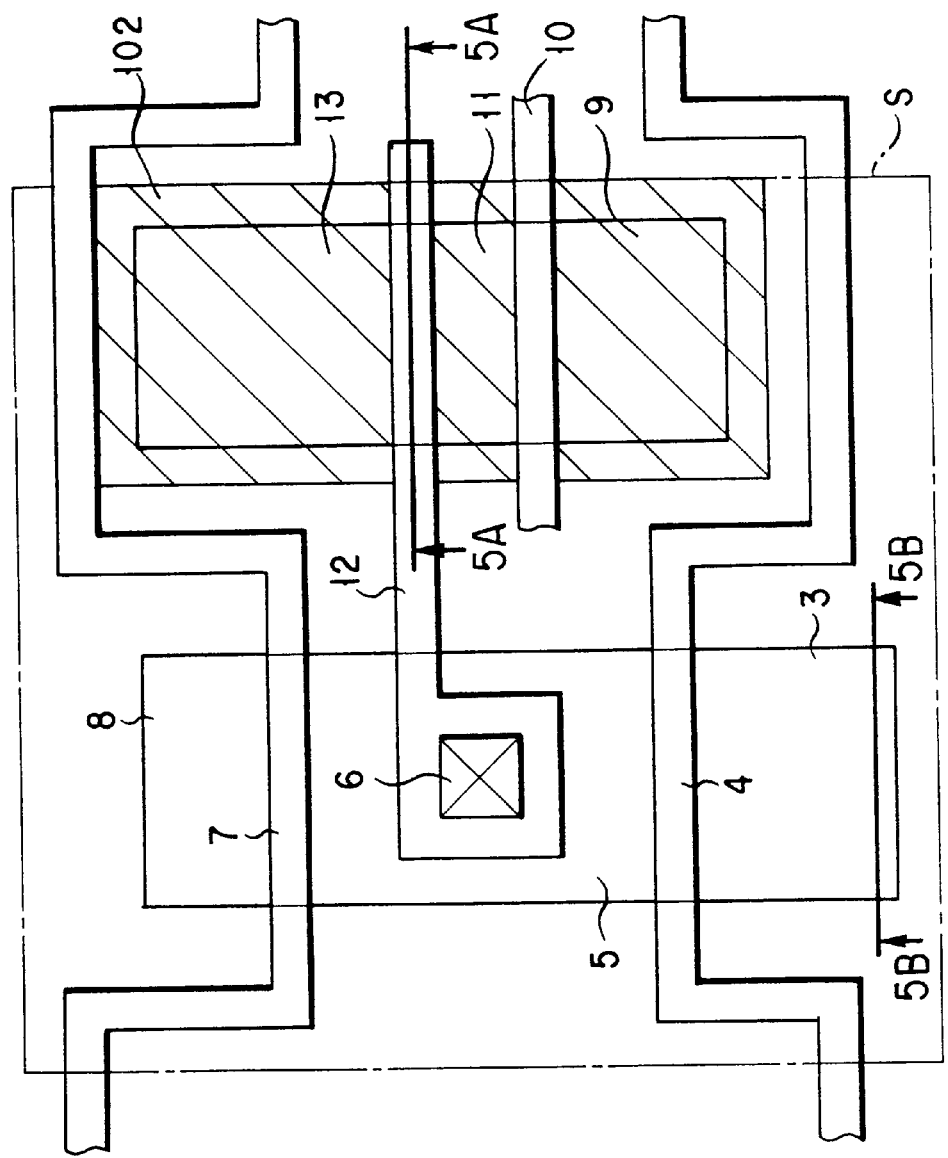
FIG. 4 is a plan view of an amplifying solid-state image sensor according to the second embodiment, for showing a layout of a unit pixel.
Figure 5A:
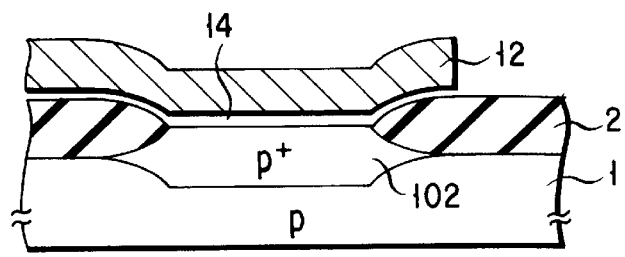
FIGS. 5A and 5B are sectional views of the amplifying solid-state image sensor shown in FIG. 4 taken along lines 5A—5A and 5B—5B.
Figure 5B:
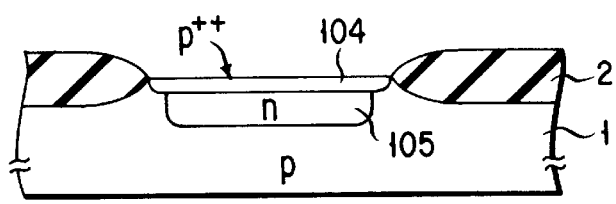

FIG. 4 is a plan view of an amplifying solid-state image sensor according to the second embodiment, for showing a layout of a unit pixel. FIGS. 5A and 5B are sectional views of the amplifying solid-state image sensor shown in FIG. 4 taken along lines 5A—5A and 5B—5B. In this embodiment, the same elements as those in FIGS. 1, 2A, and 2B are denoted by the same reference numerals throughout the drawings for simplicity of illustration, and the detailed description thereof is omitted.

In the first embodiment, the high-concentrated impurity region 101 shown in FIG. 1, which is formed to contain the active region constituting the amplifying transistor, can be formed irrelevant to the shape of the amplifying transistor active region. In contrast, the high-concentrated impurity region 102 of the second embodiment shown in FIG. 4 is formed to align the shape of the amplifying transistor active region in a self-alignment manner.

Figure 6A:
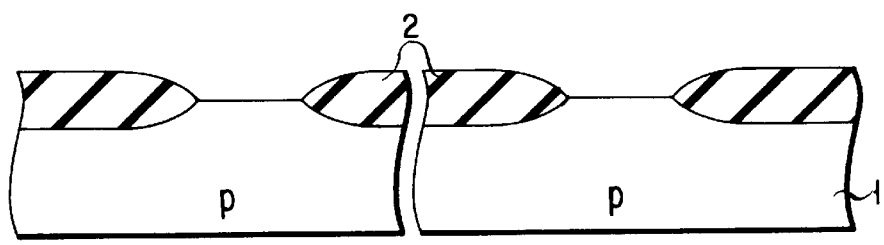
FIGS. 6A–6C show the manufacturing process of the amplifying solid-state image sensor according to the second embodiment.
Figure 6B:
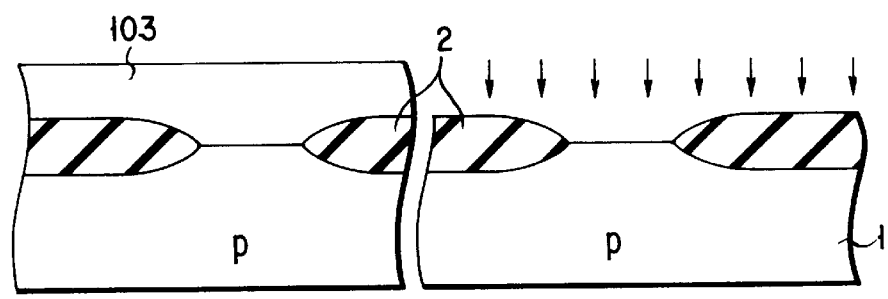
Figure 6C:
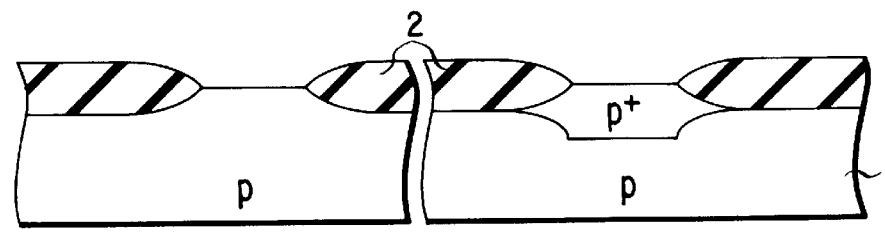

An example of the method of forming the high-concentrated impurity region 102 shown in FIG. 4 will be described below with reference to FIGS. 6A to 6C. FIGS. 6A to 6C show each step of forming the high-concentrated impurity region 102, in order. On the left side in the respective drawings, the sectional views of the photodiode taken along a line 5B—5B shown in FIG. 4 are shown, and on the right side, the sectional views of the amplifying gate taken along a line 5A—5A shown in FIG. 4 are shown.

As shown in FIG. 6A, the field oxide film 2 having a desired shape is formed on the semiconductor substrate 1. Then, as shown in FIG. 6B, a resist 103 is formed only on an active region in which a photodiode is formed, using technique such as photolithography or the like. Subsequently thereto, the impurity having the same conductivity type as that of the semiconductor substrate 1 is implanted therein. After the resist 103 for preventing ions from being implanted into the photodiode region is removed, the high-concentrated impurity region 102 shown in FIG. 6C is formed subsequent to a heat treatment performed in necessity. This forming steps of the high-concentrated impurity region 102 or the high-concentrated impurity region 102 itself never affects the photodiode region, of course.

The obtained high-concentrated impurity region 102 changes in thickness at both end portions of the field oxide film 2. The introduction of the impurity ions cannot be perfectly prevented at the bird's beak regions in a LOCOS oxide film. The high-concentrated impurity region 102 thus has a predetermined thickness in the active region, which gradually decreases toward the field oxide films from the end portions of the active region, to be lost at the most ends, as shown in FIG. 6C.

It is clear that the high-concentrated impurity region 102 shown in FIG. 4 functions in substantially the same manner as the high-concentrated impurity region 101 shown in FIG. 1, and thus the same effect as attained by the device of the first embodiment can be attained by the device described in the present embodiment: the amplifying transistor can be reduced in size in accordance with the scaling rule, and the impurity concentration of the high-concentrated impurity region 102 in this device can be designed independently from that of the photodiode impurity layer 105.

It also goes without saying that a high-concentrated field impurity concentration region which is provided immediately under the field oxide film 2 in the normal element isolation process may be formed in a section of the device if necessary, though FIGS. 5A, 5B, 6A, and 6C do not show such a region.

The present invention is not limited to each of above described embodiments. The high-concentrated impurity region can be formed in all the active regions other than the region in which the photodiode is to be formed, though, in the above-mentioned embodiments, the high-concentrated impurity region is formed only in the region in which the amplifying transistor is to be formed. Similarly, the circuit constitution of the unit pixel is not limited to the circuit constitution shown in FIG. 3, but may be formed in various constitutions if it comprises essential elements: a photoelectric conversion section having components such as a photodiode and the like; an electric signal charge storage section having components such as a storage diode and the like; a reset transistor; and an amplifying transistor.

It is also understood that other various changes and modifications may be effected therein by one skilled in the art without departing from the scope or spirit of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An amplifying solid-state image sensor comprising:
   a semiconductor substrate; and
   a plurality of unit pixels arranged on the semiconductor substrate in a two-dimensional manner, wherein
   each of the plurality of unit pixels includes
      a photodiode for performing photoelectric conversion,
      a storage diode for storing electric signal charge obtained by the photodiode,
      an amplifying transistor for amplifying the electric signal charge stored in the storage diode, and
      a signal reading section for reading a signal voltage from the amplifying transistor, and wherein
   each of the plurality of unit pixels has a first active region and a second active region in which the second active region has the same conductivity type as that of the semiconductor substrate and an impurity concentration higher than that of the semiconductor substrate,
   the photodiode in each of the unit pixels is formed in the first active region, and
   the amplifying transistor is formed in the second active region.

2. The amplifying solid-state image sensor according to claim 1, wherein the photodiode has near a surface thereof a pinned photodiode structure in which a photodiode surface high-concentrated impurity region is formed.

3. The amplifying solid-state image sensor according to claim 1, wherein said first and second active regions are surrounded with a field insulation film.

4. The amplifying solid-state image sensor according to claim 3, wherein said second active region is formed by performing ion implantation in an active region after forming said field insulation film to isolate elements on said semiconductor substrate.

5. The amplifying solid-state image sensor according to claim 4, wherein said second active region has a higher impurity concentration than said substrate and is formed in a self-alignment manner with an aperture in said field insulation film.

6. An amplifying sold-state image sensor comprising:
   a semiconductor substrate; and
   a plurality of unit pixels arranged on the semiconductor substrate in a two-dimensional manner, wherein
   each of the plurality of unit pixels includes a photodiode for performing photoelectric conversion, a storage diode for storing electric signal charge obtained by the photodiode, an amplifying transistor for amplifying the electric signal charge stored in the storage diode, and a signal reading section for reading a signal voltage from the amplifying transistor, and wherein each of the plurality of unit pixels has a first active region and a second active region in which the second active region has the same conductivity type as that of the semiconductor substrate and an impurity concentration higher than that of the semiconductor substrate, the photodiode in each of the unit pixels is formed in the first active region, the amplifying transistor is formed in the second active region, and p2 the second active region is formed in a self-alignment manner with an aperture of a field insulation film.

7. An amplifying sold-state image sensor comprising:

a semiconductor substrate; and a plurality of unit pixels arranged on the semiconductor substrate in a two-dimensional manner, wherein each of the plurality of unit pixels includes a photodiode for performing photoelectric conversion, a storage diode for storing electric signal charge obtained by the photodiode, an amplifying transistor for amplifying the electric signal charge stored in the storage diode, and a signal reading section for reading a signal voltage from the amplifying transistor, and wherein each of the plurality of unit pixels has a first active region and a second active region in which second active region has the same conductivity type as that of the semiconductor substrate and an impurity concentration higher than that of the semiconductor substrate, the photodiode in each of the unit pixels is formed in the first active region, the amplifying transistor is formed in the second active region, and the second active region is formed in a manner, in which at least a width between edges of a field insulation film and the second active region and a width between edges opposite thereto are substantially equal.

\* \* \* \* \*